(12) United States Patent
Tsai et al.

(10) Patent No.: US 10,505,037 B2
(45) Date of Patent: Dec. 10, 2019

(54) P-CHANNEL DEMOS DEVICE

(71) Applicant: Texas Instruments Incorporated, Dallas, TX (US)

(72) Inventors: Chin-Yu Tsai, Allen, TX (US); Imran Khan, Richardson, TX (US); Xiaoju Wu, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/915,529

(22) Filed: Mar. 8, 2018

(65) Prior Publication Data

US 2018/0197986 A1 Jul. 12, 2018

Related U.S. Application Data

(62) Division of application No. 15/135,154, filed on Apr. 21, 2016, now Pat. No. 9,947,783.

(51) Int. Cl.

| H01L 29/66 | (2006.01) |
| H01L 29/78 | (2006.01) |
| H01L 29/06 | (2006.01) |
| H01L 21/762 | (2006.01) |
| H01L 21/761 | (2006.01) |
| H01L 29/423 | (2006.01) |
| H01L 29/10 | (2006.01) |

(52) U.S. Cl.
CPC ........ *H01L 29/7816* (2013.01); *H01L 21/761* (2013.01); *H01L 21/762* (2013.01); *H01L 21/76202* (2013.01); *H01L 21/76224* (2013.01); *H01L 29/0619* (2013.01); *H01L 29/0649* (2013.01); *H01L 29/0696* (2013.01); *H01L 29/66568* (2013.01); *H01L 29/66681* (2013.01); *H01L 29/7833* (2013.01); *H01L 29/1045* (2013.01); *H01L 29/1087* (2013.01); *H01L 29/42368* (2013.01)

(58) Field of Classification Search
CPC ...... H01L 29/66; H01L 29/78; H01L 29/7816
See application file for complete search history.

(56) References Cited

U.S. PATENT DOCUMENTS

| 7,915,678 | B1 | 3/2011 | Vashchenko |
| 8,174,071 | B2 | 5/2012 | Tien et al. |
| 9,608,109 | B1 * | 3/2017 | Tsai ............... H01L 21/761 |
| 2006/0124999 | A1 | 6/2006 | Pendharkar |
| 2016/0336427 | A1 | 11/2016 | Zhang et al. |

* cited by examiner

*Primary Examiner* — Fazli Erdem
(74) *Attorney, Agent, or Firm* — Jacqueline J. Garner; Charles A. Brill; Frank D. Cimino

(57) ABSTRACT

A p-channel drain extended metal oxide semiconductor (DEPMOS) device includes a doped surface layer at least one nwell finger defining an nwell length and width direction within the doped surface layer. A first pwell is on one side of the nwell finger including a p+ source and a second pwell is on an opposite side of the nwell finger including a p+ drain. A gate stack defines a channel region of the nwell finger between the source and drain. A field dielectric layer is on a portion of the doped surface layer defining active area boundaries including a first active area having a first active area boundary including a first active area boundary along the width direction (WD boundary). The nwell finger includes a reduced doping finger edge region over a portion of the WD boundary.

18 Claims, 8 Drawing Sheets

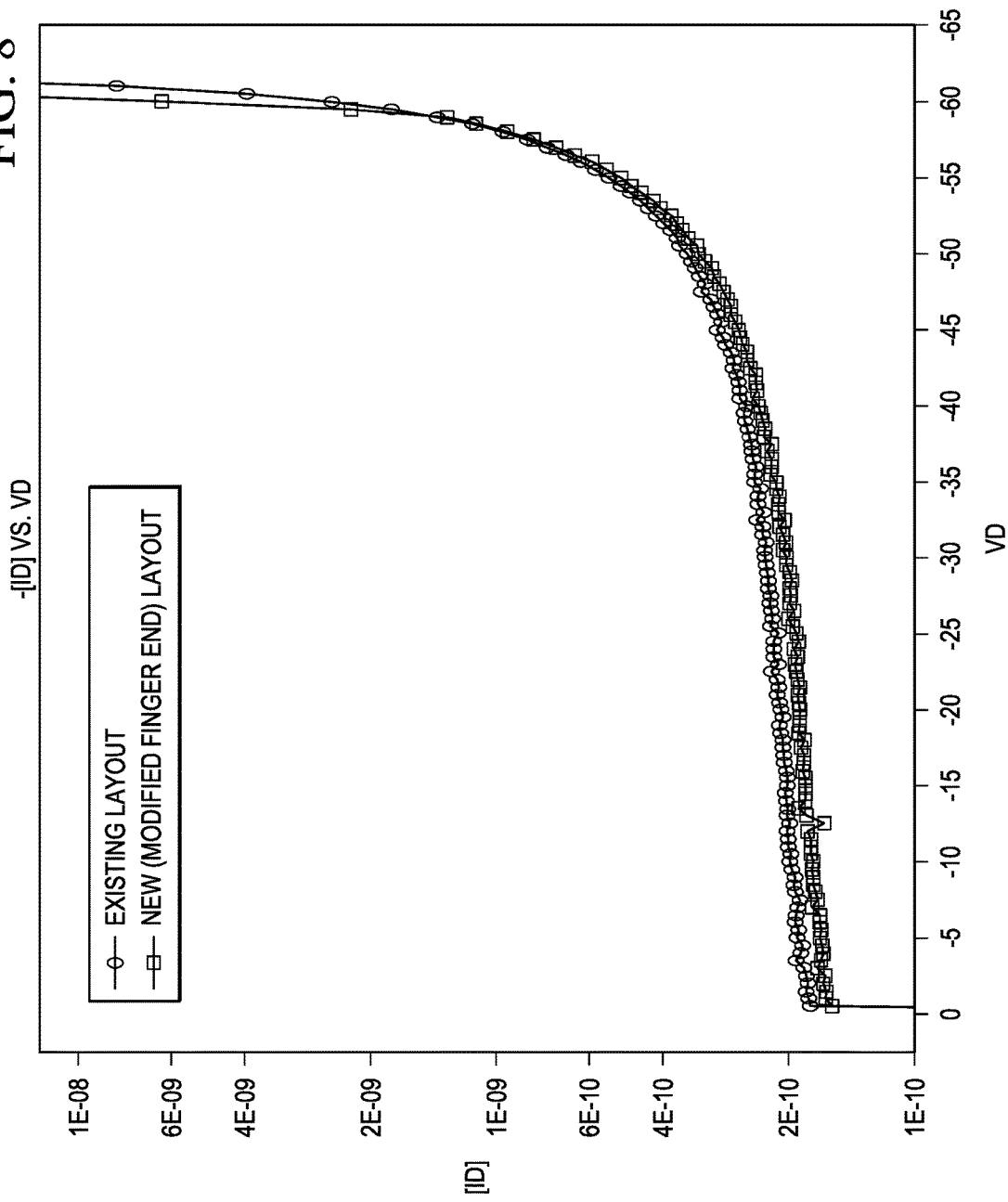

P-CHANNEL DEMOS DEVICE

CROSS REFERENCE TO RELATED APPLICATIONS

This application is a divisional of U.S. Nonprovisional patent application Ser. No. 15/135,154, filed Apr. 21, 2016, the contents of which are herein incorporated by reference in their entirety.

FIELD

Disclosed embodiments relate to p-channel drain extended metal oxide semiconductor (DEPMOS) devices.

BACKGROUND

Power semiconductor devices can be fabricated using n- or p-channel DEMOS structures. DEPMOS devices extend the p+ drain of the device by adding a p-type drain drift region between the drain and the channel region of the device, trapping the majority of the electric field in this drift region instead of the channel region, therefore containing hot carrier effects to the drift region, instead of the channel region therefore increasing hot carrier reliability. The DEMOS device can have a symmetric drain structure or an asymmetric drain structure.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize for conventional p-channel drain extended metal oxide semiconductor (DEPMOS) devices having fingers the nwell finger (functioning as a n-doped body) can have the n-type doping piled up at the semiconductor surface at the finger ends under the field dielectric layer. The n-type doping pile up is particularly a problem in the case the field dielectric layer is a Local Oxidation of Silicon (LOCOS) oxide and the region is the birds beak area. This higher n-type dopant concentration has been found to result in increased impact ionization DEPMOS device leakage at ON-state with high back gate bias levels causing increased transient leakage and parametric shifts (e.g., in ON-resistance (Ron)).

Disclosed nwell finger designs have reduced doping finger edge regions including over an active area/field dielectric boundary to reduce impact ionization leakage at the finger-ends. A p-doped layer can added (typically by ion implantation) at the finger end inside the nwell edge close to the active region boundary with the field dielectric. Another embodiment has a gap in the nwell implant doping through masking the nwell implant at the finger end inside the nwell edge close to the active region boundary with the field dielectric.

BRIEF DESCRIPTION OF THE DRAWINGS

Reference will now be made to the accompanying drawings, which are not necessarily drawn to scale, wherein:

FIG. 8 shows measured DEPMOS Off leakage and BVdss characteristics for a DEPMOS device with a known nwell finger design and for a DEPMOS device with a disclosed nwell finger design including a reduced doping finger edge region. The respective DEPMOS devices' BVdss and Ioff characteristics are shown have no significant difference.

DETAILED DESCRIPTION

Figure 1:
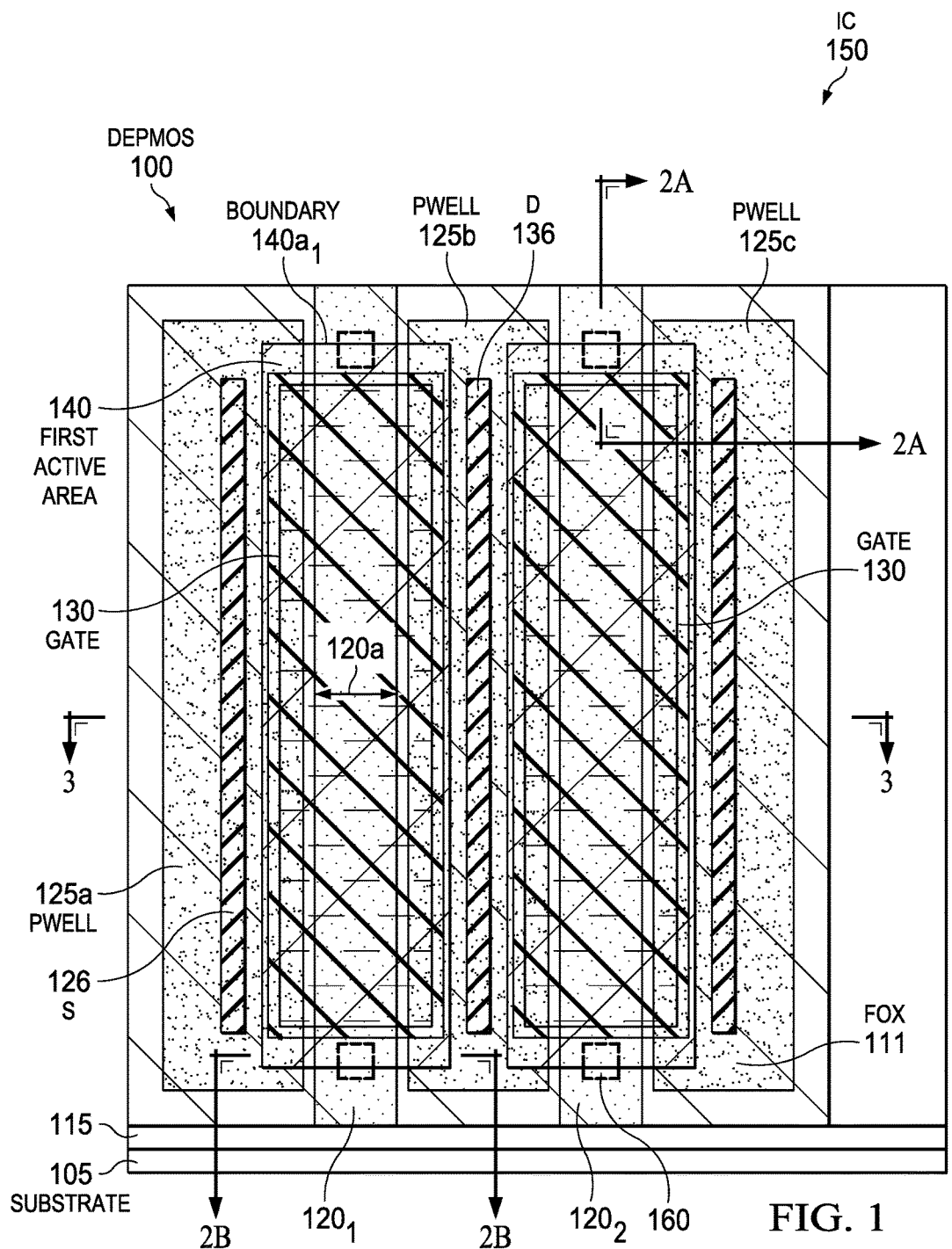
FIG. 1 is top view depiction of an integrated circuit (IC) including an example DEPMOS device having a disclosed reduced doping finger edge region within the nwell finger including over an active area/field dielectric boundary, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is top view depiction of an IC 150 including an example DEPMOS device 100 having a disclosed reduced doping finger edge region 160 within the nwell fingers $120_1$ and $120_2$ including over an active area/field dielectric boundary 140a, according to an example embodiment.

Although shown on IC 150, DEPMOS device 100 can also be embodied as a discrete die. The region shown to the right of the DEPMOS device 100 generally includes a plurality of other transistors, as well as resistors and capacitors all configured together to provide a circuit function. DEPMOS device 100 is shown having a symmetric drain structure (has a symmetrical structure with respect to source and drain), although this is not required as disclosed embodiments also apply to asymmetric drain designs. Moreover, although the nwell fingers $120_1$ and $120_2$ are shown being rectangular in shape, the nwell fingers can have other shapes, such as having rounded corners.

The IC 150 comprises a substrate 105 having a doped surface layer 115 thereon. The substrate 105 can be a bulk substrate material (e.g., silicon) that provides the surface layer 115 too, or the surface layer 115 can be an epitaxial layer on a substrate comprising a bulk substrate material. The substrate 105 and/or surface layer 115 can comprise silicon, silicon-germanium, or other semiconductor material. The substrate 105 and surface layer 115 can both be n-type or p-type, with one specific embodiment being a p-type substrate and a p-type surface layer that is an epitaxial layer.

Although the DEPMOS device 100 is shown having two (2) nwell fingers $120_1$ and $120_2$, more generally, DEPMOS device 100 can have a single nwell finger, or more than 2 nwell fingers. The nwell fingers $120_1$, $120_2$ define an nwell length direction and a smaller nwell width direction. The nwell fingers $120_1$, $120_2$ have an nwell doping, and are formed within the doped surface layer 115, typically by ion implantation.

The nwell fingers $120_1$, $120_2$ are shown between pwells. Nwell finger $120_1$ is shown between the first pwell 125a and the second pwell 125b. Nwell finger $120_2$ is shown between the second pwell 125b and a third pwell 125c. A p+ source (S) 126 is shown in the first pwell 125a and p+ drain (D) 136 is shown in the second pwell 125b.

A gate stack is over a channel region 120a of the nwell fingers $120_1$, $120_2$ including over the nwell finger $120_1$ between the S 126 and the D 136. The gate stack includes a gate dielectric layer and a patterned gate electrode 130 on the gate dielectric layer (the gate dielectric layer is not shown in FIG. 1, see FIG. 3 described below). The gate electrode 130 can comprise polysilicon, or other gate electrode materials such as a metal, and the gate dielectric layer can comprise dielectrics such as silicon oxide or silicon oxynitride.

A field dielectric layer 111 shown as a field oxide (FOX) layer is on a portion of the doped surface layer 115 defining active areas (where the field dielectric layer 111 is lacking) including a first active area 140 having a first active area/field dielectric boundary 140a including a first active area boundary along the nwell width direction (WD boundary) 140a1. The field dielectric layer 111 can comprise a LOCOS oxide layer, in which case there will be a birds beak region in the field dielectric layer 111 transition region at the edge of the active areas. (See FIG. 2A described below). Alternatively, field dielectric layer 111 can comprise shallow trench isolation (STI). In the case of STI, if there is a conventional added channel stop implant along the STI edge, the channel stop implant can benefit from a disclosed reduced doping finger edge region, such as being blocked off or being compensated with counter doping similar to the LOCOS oxide edge case generally described herein.

It is recognized herein upon thermal oxidation of silicon there is an increase in n-type dopant concentration at the silicon surface exhibited by n-type dopants such as arsenic and phosphorus referred to as "pile-up". This enhancement in n-type dopant concentration at the Si surface resulting from thermal oxidation can be a particularly important factor in LOCOS technology. The reduced doping finger edge region 160 being at the nwell finger end close to first active area 140 reduces the otherwise excessive n-type doping present at the birds beak region (FOX transition region) which has been found to reduce the field at the ON-state with high back gate bias.

The nwell fingers $120_1$, $120_2$ each includes a reduced doping finger edge region 160 over a portion of the WD boundary 140a1 on each end of the fingers. The reduced doping finger edge region 160 can comprise a region counter doped with a p-type dopant, such as provided by an ion implantation typically with boron. For example, a maximum concentration of the p-type dopant in the reduced doping finger edge region 160 is generally between $1\times10^{16}$ cm$^{-3}$ to $1\times10^{18}$ cm$^{-3}$, which can be more or less than the nwell doping (so that reduced doping finger edge region 160 has a reduced n-type level or becomes p-type). In one embodiment the boron dose can be selected to be high enough to counter dope the nwell(s) in the reduced doping finger edge region 160 to remain n-type to ensure a p-channel (when DEPMOS is ON) to nwell finger junction breakdown voltage that is high enough for a given application. The reduced doping finger edge region 160 can also comprise a region lacking direct nwell doping, such as by also masking this region (e.g. with photoresist) during the nwell implant. Due to lateral diffusion of the nwell, even without direct (implanted) nwell doping, this region n-dopes the doping in the doped surface layer 115, so that if the doped surface layer 115 is p-doped, this reduced doping finger edge region 160 generally becomes reduced p-type doping or reduced level n-type doping.

The reduced doping finger edge region 160 can extend a total of between 1 μm and 4 μm in the nwell length direction. The reduced doping finger edge region 160 is generally recessed from the edges of the nwell fingers $120_1$, $120_2$ as shown in FIG. 1 to help ensure low D136 to S 126 leakage.

Figure 2A:
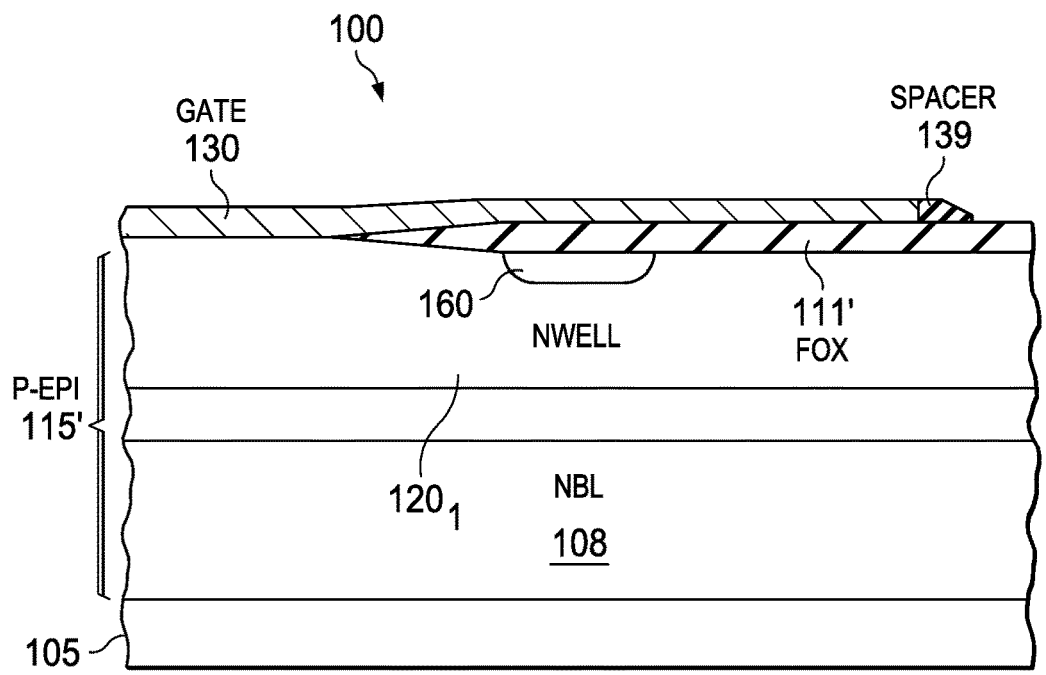
FIG. 2A is a cross sectional depiction of the DEPMOS device shown in FIG. 1 cut in the nwell length direction around the active area/field dielectric boundary along the nwell width direction.

FIG. 2A is a cross sectional depiction of the DEPMOS device 100 shown in FIG. 1 cut in the nwell finger length direction around the active area/field dielectric layer boundary along the nwell width direction. Here the field dielectric layer 111 comprises a LOCOS oxide layer 111' and the reduced doping finger edge region 160 can be seen to be positioned in the nwell finger $120_1$ birds beak region. A spacer 139 is shown on the edge of the gate electrode 130. The surface layer is shown being a p-epi surface layer 115' that includes an n-buried layer (NBL) 108 below the nwell finger $120_1$. The surface of the nwell finger $120_1$ in the active area can be p-doped with a VTPHV surface layer that dopes the active region to adjust the voltage threshold (Vt) of the buried channel PMOS.

Figure 2B:
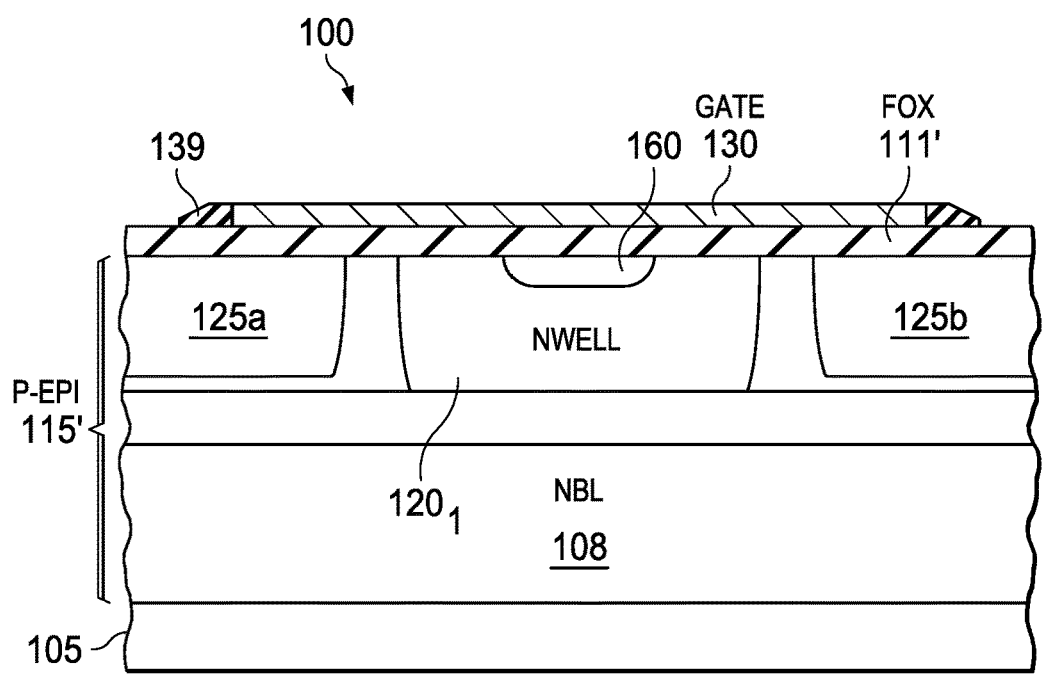
FIG. 2B is a cross sectional depiction of the DEPMOS device shown in FIG. 1 cut in the nwell width direction around the active area/field dielectric boundary along the nwell width direction.

FIG. 2B is a cross sectional depiction of the DEPMOS device 100 shown in FIG. 1 cut in the nwell width direction around the active area/field dielectric boundary along the nwell width direction. The first and second pwells 125a, 125b are shown. The nwell finger $120_1$ under the LOCOS oxide layer 111' is shown having a reduced doping finger edge region 160, such as by counter doping the nwell doping with a p-type implant.

Figure 3:
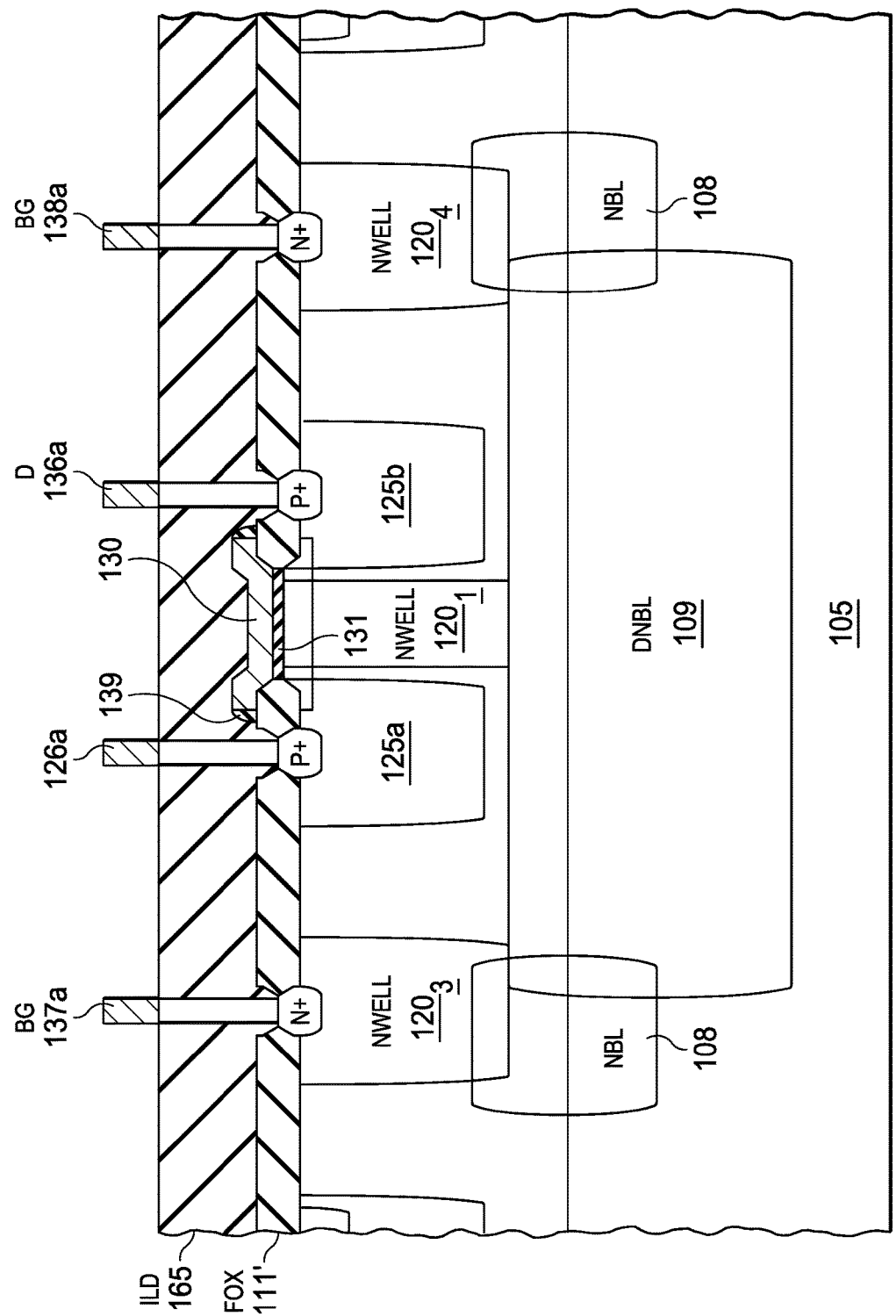
FIG. 3 is a depiction of the DEPMOS device shown in FIG. 1 cut in the nwell width direction around the center of the nwell finger.

FIG. 3 is a depiction of the DEPMOS device 100 shown in FIG. 1 cut in the nwell width direction around the center of the nwell finger to show the gate dielectric 131 under the gate electrode 130. In the embodiment shown the substrate 105 is a p-type substrate. Various surface contacts are shown through an interlevel dielectric (ILD) shown as ILD 165, including contact 126a to the S, contact 136a to the D, and contacts 137a and 138a to the back gate (BG). Since as disclosed above disclosed reduced doping finger edge regions 160 are provided at the finger edges along the edges in the finger length direction, there is no reduced doping finger edge region 160 provided in the center portion of the DEPMOS device 100 as shown in FIG. 3.

The DEPMOS device in FIG. 3 is shown including a first additional nwell fingers $120_3$ beyond the first pwell 125a opposite the nwell finger $120_1$ and a second additional nwell finger $120_4$ beyond the second pwell 125b opposite the nwell finger $120_1$. The additional nwell fingers $120_3$ and $120_4$ together with the NBL 108 shown which functions as an n-type sinker along with the deep NBL (DNBL) 109 which form an n-type 'tank' that through reverse biasing during DEPMOS device operation enables the S 126 and D 136 of the DEPMOS device to be junction isolated from other components on the die, such as from other transistors. However, if the substrate 105 is instead ntype, there is generally no need for the DNBL 109 and NBL 108 to provide isolation for the S 126 and the D 136 of the DEPMOS device.

Figure 4:
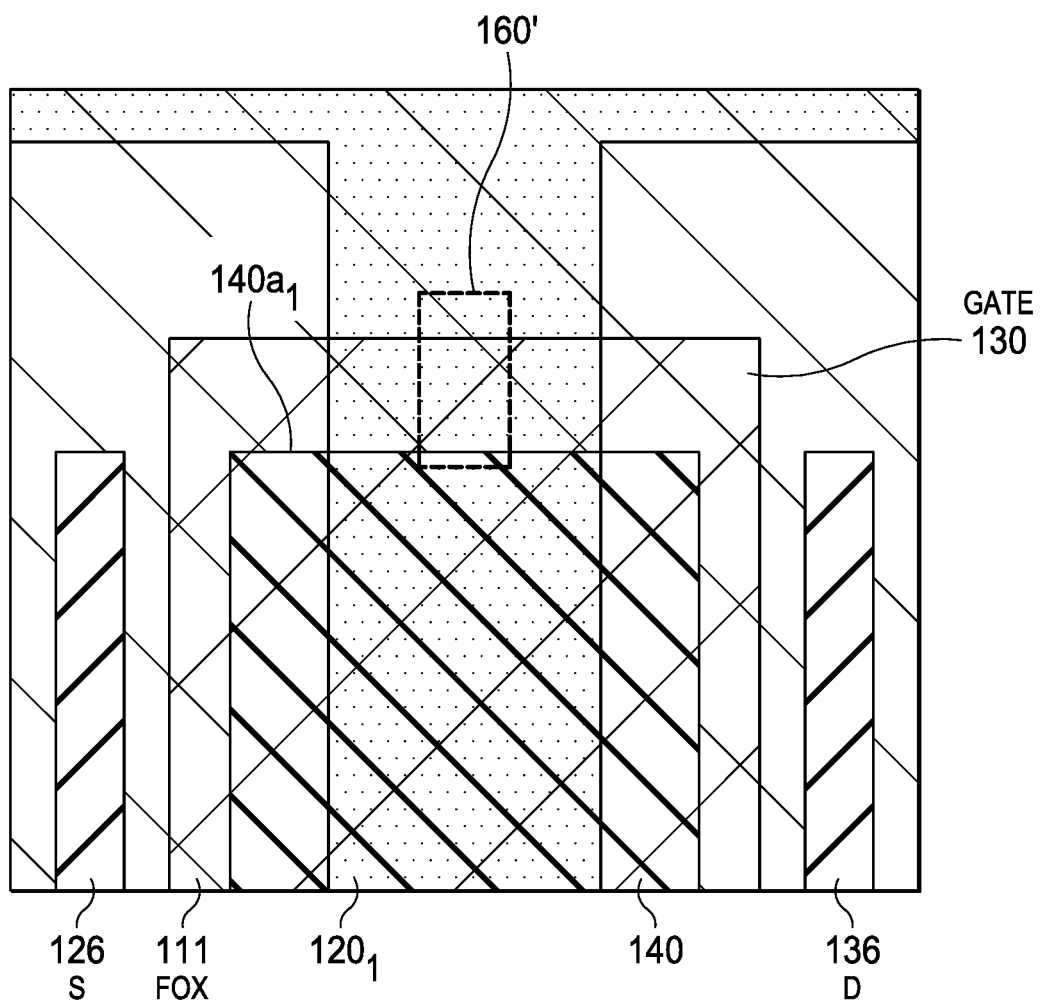
FIG. 4 is an example DEPMOS finger end layout showing a finger end including a disclosed reduced doping finger edge region within the nwell finger including over an active area/field dielectric boundary, according to an example embodiment.

FIG. 4 is an example DEPMOS finger end layout showing a finger end including a disclosed reduced doping finger edge region 160' within the nwell finger $120_1$ including over an active area/field dielectric boundary 140a, according to an example embodiment. Here the disclosed reduced doping finger edge region 160' lacks the nwell doping, such as by masking the reduced doping finger edge region 160' during nwell implant. Such a dopant 'hole' in the nwell finger $120_1$ also reduces the n-type doping pile up under the birds beak region that can cause impact ionization at ON-state with high back gate bias levels causing increased transient leakage and parametric shifts as described above.

Figure 5:
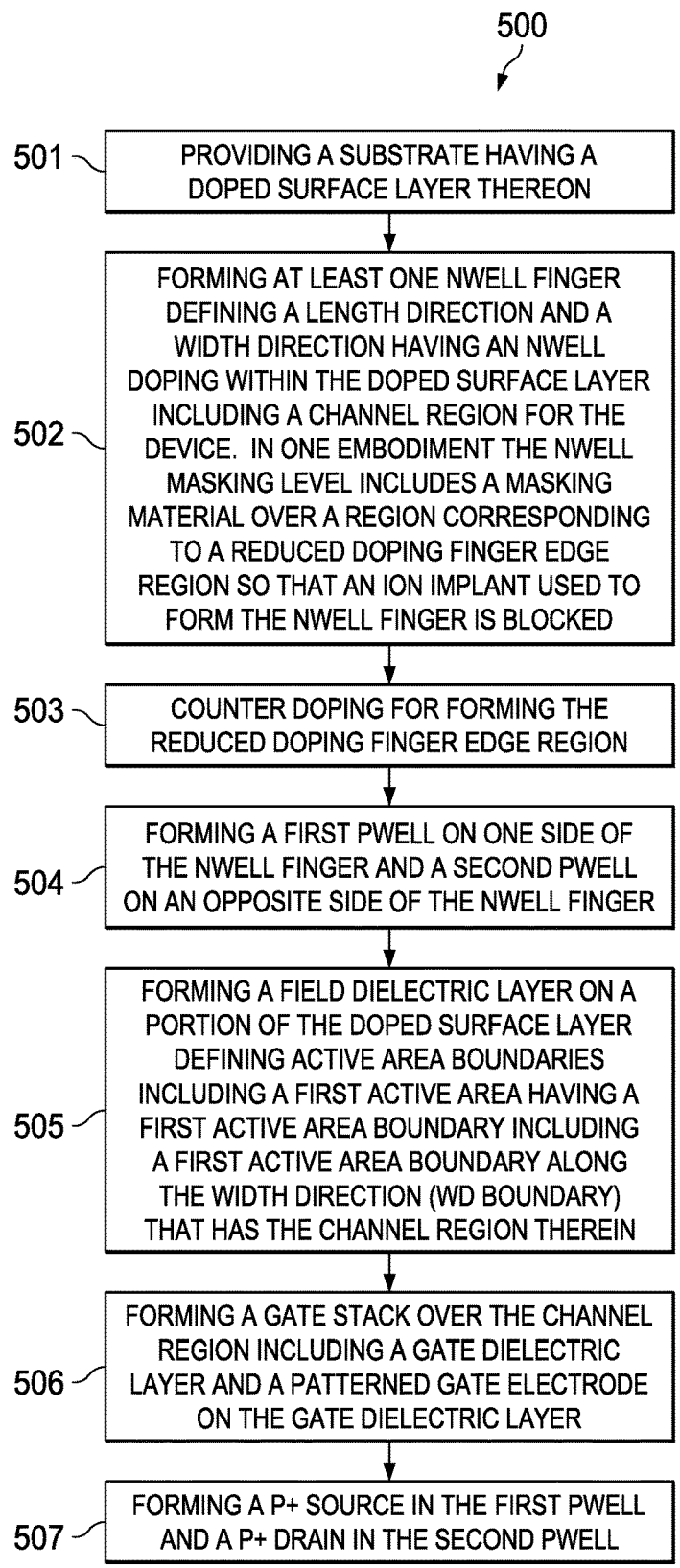
FIG. 5 is a flow chart showing steps in an example method for forming an IC including a DEPMOS device including a disclosed reduced doping finger edge region within the nwell finger including over an active area/field dielectric boundary, according to an example embodiment.

FIG. 5 is a flow chart showing steps in an example method 500 for forming an IC having a DEPMOS device including a disclosed reduced doping finger edge region within the nwell finger including over an active area/field dielectric boundary, according to an example embodiment. Step 501 comprises providing a substrate 105 having a doped surface layer 115 thereon. Step 502 comprises forming at least one nwell finger 120 defining a length direction and a width direction having an nwell doping within the surface layer 115 including a channel region 120a for the device. A typical nwell implant dose is of about $1\times10^{13}$ cm$^{-2}$ to provide an approximate nwell doping level $1\times10^{16}$ to $1\times10^{17}$ cm$^{-3}$. In one embodiment the nwell masking level includes a masking material (e.g., photoresist) over the region corresponding to the reduced doping finger edge region 160 so that an ion implant used to form the nwell finger 120 is blocked.

Step 503 comprises the counterdoping embodiment for forming the reduced doping finger edge region 160. Step 504 comprise implanting boron in the reduced doping finger edge region 160 at a dose that can be between $1\times10^{12}$ cm$^{-2}$ and $1\times10^{13}$ cm$^{-2}$, and at an energy that can be between 90 KeV and 200 KeV. As a result, the reduced doping finger edge region 160 can be either lightly n-doped or lightly p-doped. Although step 503 is described being before forming the gate stack (step 506 described below), step 503 can also be performed after forming the gate stack (step 506).

Step 504 comprises forming a first pwell 125a on one side of the nwell finger 120 and a second pwell 125b on an opposite side of the nwell finger 120. Boron ion implantation can be used to form the pwells. Step 505 comprises forming a field dielectric layer 111 on a portion of the doped surface layer 115 defining active area boundaries including a first active area 140 having a first active area boundary 140a including a first active area boundary along the width direction (WD boundary) 140a1 that has the channel region 120a therein. As noted above, the field dielectric layer 111 can comprises a LOCOS oxide or STI oxide.

Step 506 comprises forming a gate stack between over the channel region 120a including a gate dielectric layer 131 and a patterned gate electrode 130 on the gate dielectric layer 131. Step 507 comprises forming a p+ source in the first pwell 125a and a p+ D in the second pwell 125b.

As noted above, in one embodiment the field oxide layer comprises a LOCOS oxide layer and a p-type layer is selectively implanted at the finger ends inside the nwell finger close to the active region edge. This added p-type layer counter dopes the excessive n-type doping in the nwell in the birds beak region reducing the field for the DEPMOS device when operating in the ON-state with a high back gate bias level. Disclosed reduced doping finger edge regions thus prevent DEPMOS device ON-state leakage from the finger end near the active area edge with minimum impact to the intrinsic device characteristics (see Examples section below). Disclosed reduced doping finger edge regions do not require any additional masks, as the nwell implant blocking embodiment uses a modified nwell mask, and the implanted counterdoped embodiment can generally utilize an existing implant in the process flow, such as an n-channel threshold adjust implant in a CMOS process flow or in a BiCMOS process flow.

EXAMPLES

Disclosed embodiments are further illustrated by the following specific Examples, which should not be construed as limiting the scope or content of this Disclosure in any way.

Figure 6:
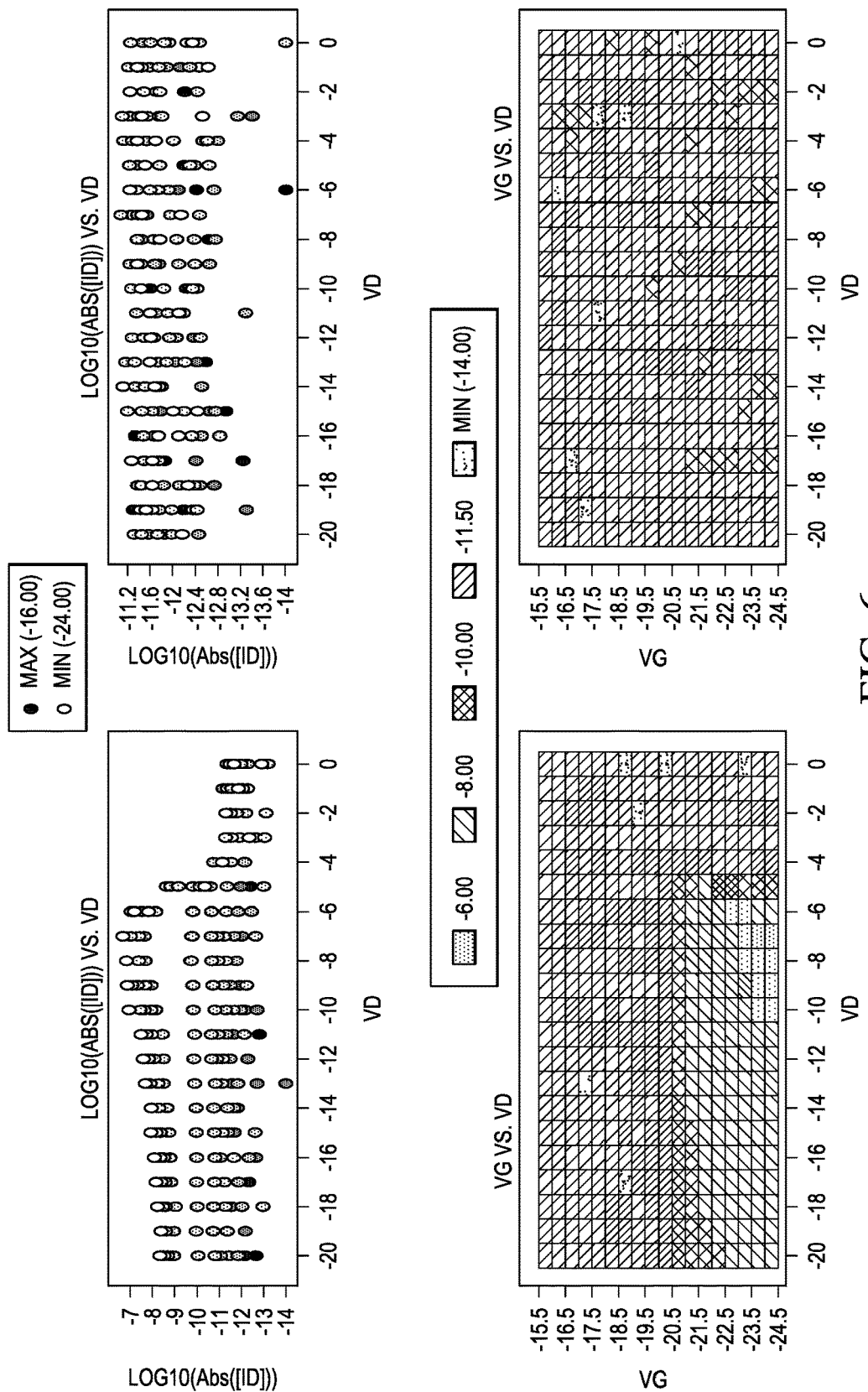
FIG. 6 shows measured transient leakage data comparing a DEPMOS device with a known nwell finger design with a DEPMOS device having a disclosed nwell finger design including a reduced doping finger edge region.

FIG. 6 shows measured transient leakage data comparing a DEPMOS device with a known nwell finger design (no reduced doping finger edge region 160) with a disclosed DEPMOS device with a disclosed nwell finger design including a reduced doping finger edge region 160. The back gate voltage ($V_b$) was 20V and the source voltage Vs was floating. The upper graphs are the absolute leakage values and the lower graphs are the leakage contour vs. $V_G$ and $V_D$.

Figure 7:
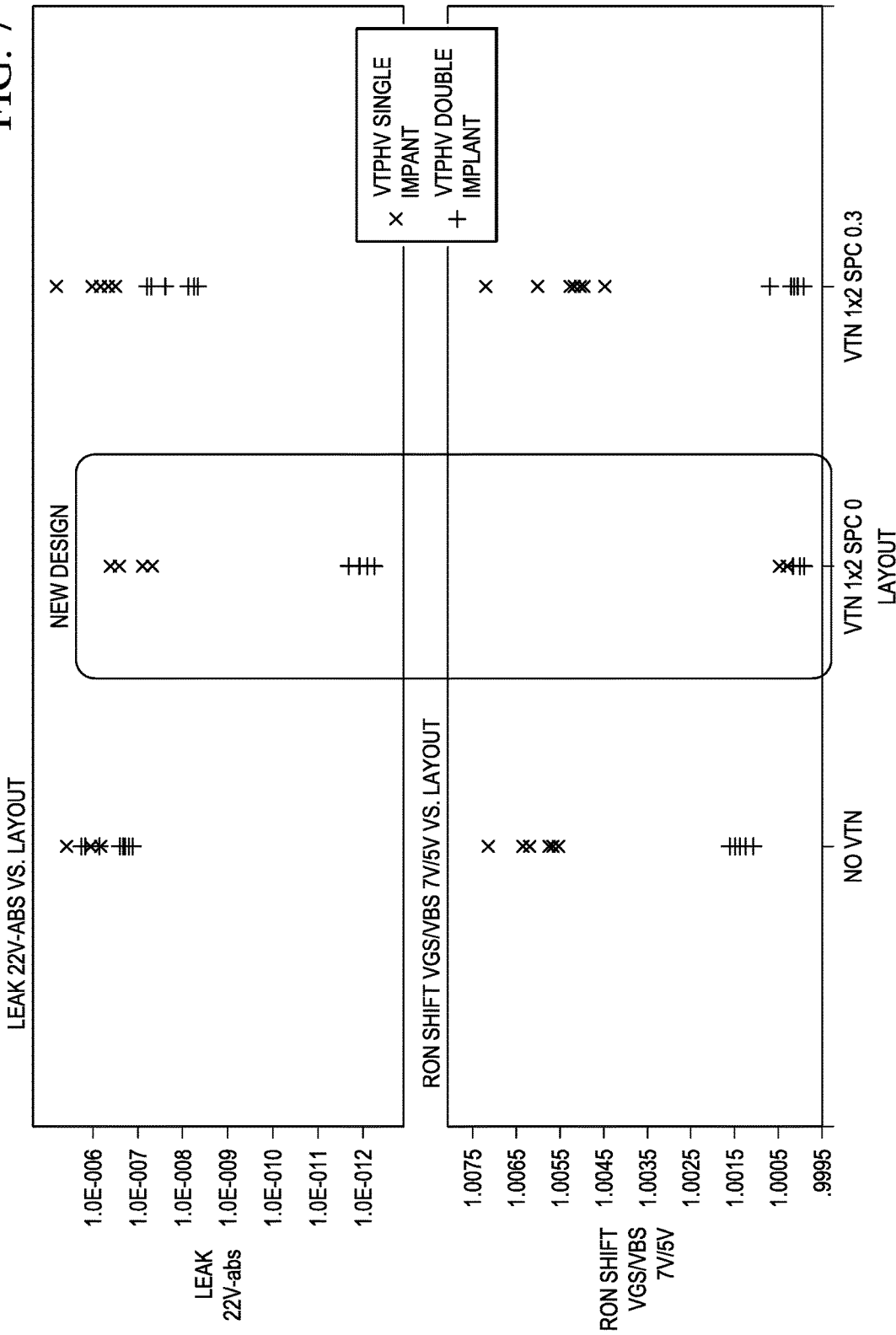
FIG. 7 shows measured DEPMOS low temperature peak transient leakage and Ron Shift data for a DEPMOS device having a known nwell finger design corresponding to the "no VTN" implant shown, and with a DEPMOS device with a disclosed nwell finger design including a reduced doping finger edge region shown with a single or double VTN implant shown.

FIG. 7 shows measured DEPMOS low temperature peak transient leakage and the Ron Shift for a DEPMOS device having a known nwell finger design (no reduced doping finger edge region 160) corresponding to the "no VTN" shown, and with a DEPMOS device with a disclosed nwell finger design including a reduced doping finger edge region 160 shown with a single or double VTN implant shown. The VTN implant was a chain of boron implants with a deepest implant in the chain being at a dose of $5\times10^{12}$ cm$^{-2}$ at 165 Kev. The DEPMOS On-state peak leakage is shown at $-40°$ C., VG/VB=$-22$V/22V, $V_S$=Open, $V_D$ sweeps: $-22$V to 22V on the top, and the Ron shift after a stress of VG/VB=$-22$V/22V, $V_S$=Open, $V_D$ sweeps: $-22$V to 22V at the bottom.

FIG. 8 shows measured DEPMOS Off leakage and BVdss characteristics for a DEPMOS device with a known nwell finger design and for a DEPMOS device with a disclosed nwell finger design including a reduced doping finger edge region. The respective DEPMOS devices' BVdss and Ioff characteristics can be seen to have no significant difference.

Disclosed embodiments can be used to form semiconductor die including discrete or IC die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, the DEPMOS device can be in a race track layout.

The invention claimed is:

1. A p-channel drain extended metal oxide semiconductor (DEPMOS) device, comprising:
   a substrate having a doped surface layer thereon;
   at least one nwell finger defining a nwell length direction and an nwell width direction having nwell doping formed within said doped surface layer;
   a first pwell on one side of said nwell finger including a p+ source therein and a second pwell on an opposite side of said nwell finger including a p+ drain;
   a gate stack defining a channel region of said nwell finger between said source and said drain including a gate dielectric layer and a patterned gate electrode on said gate dielectric layer;
   a field dielectric layer on a portion of said doped surface layer defining active area boundaries including a first active area having a first active area boundary including a first active area boundary along said width direction (WD boundary),
   wherein said nwell finger includes a reduced doping finger edge region over a portion of said WD boundary.

2. The DEPMOS of claim 1, wherein said field dielectric layer comprises a Local Oxidation of Silicon (LOCOS) oxide.

3. The DEPMOS of claim 1, wherein said reduced doping finger edge region comprises a region counterdoped with a p-type dopant.

4. The DEPMOS of claim 1, wherein said reduced doping finger edge region comprises a region lacking said nwell doping.

5. The DEPMOS of claim 1, wherein said reduced doping finger edge region extends a total of between 1 μm and 4 μm in said nwell length direction, and is recessed from an edge of said nwell finger in said nwell width direction.

6. The DEPMOS of claim 1, wherein said at least one nwell finger comprises a plurality of said nwell fingers.

7. The DEPMOS of claim 1, wherein said DEPMOS device has a symmetric drain structure.

8. An integrated circuit (IC) comprising a substrate including a doped surface layer thereon having a p-channel drain extended metal oxide semiconductor (DEPMOS) device formed in said doped surface layer, said DEPMOS device comprising:
   at least one nwell finger defining a nwell length direction and an nwell width direction having nwell doping formed within said doped surface layer;
   a first pwell on one side of said nwell finger including a p+ source therein and a second pwell on an opposite side of said nwell finger including a p+ drain;
   a gate stack defining a channel region of said nwell finger between said source and said drain including a gate dielectric layer and a patterned gate electrode on said gate dielectric layer, and
   a field dielectric layer on a portion of said doped surface layer defining active area boundaries including a first active area having a first active area boundary including a first active area boundary along said width direction (WD boundary),
   wherein said nwell finger includes a reduced doping finger edge region over a portion of said WD boundary.

9. The IC of claim 8, wherein said field dielectric layer comprises a Local Oxidation of Silicon (LOCOS) oxide.

10. The IC of claim 8, wherein said reduced doping finger edge region comprises a region counterdoped with a p-type dopant.

11. The IC of claim 8, wherein said reduced doping finger edge region comprises a region lacking said nwell doping.

12. An integrated circuit, comprising:
    a substrate;
    a p-channel drain extended metal oxide semiconductor (DEPMOS) device at the substrate, the DEPMOS device having:
       a doped surface layer in the substrate;
       at least one nwell finger defining a nwell length direction and an nwell width direction, the nwell finger having a first n-type dopant concentration within the doped surface layer;
       a first pwell on one side of the nwell finger including a p+ source therein and a second pwell on an opposite side of the nwell finger including a p+ drain;
       a gate stack over the nwell finger between the source and the drain including a gate dielectric layer and a patterned gate electrode on the gate dielectric layer;
       a field dielectric layer on a portion of the doped surface layer defining active area boundaries including a first active area having a first active area boundary along the nwell width direction,
       wherein the nwell finger includes a finger edge region over a portion of the first active area boundary along the nwell width direction, the finger edge region having a net n-type dopant concentration less than the first n-type dopant concentration.

13. The integrated circuit of claim 12, wherein the field dielectric layer comprises a Local Oxidation of Silicon (LOCOS) oxide.

14. The integrated circuit of claim 12, wherein the finger edge region comprises a region counterdoped with a p-type dopant.

15. The integrated circuit of claim 12, wherein the finger edge region comprises less n-type dopant than a region of the nwell finger with the first n-type dopant concentration.

16. The integrated circuit of claim 12, wherein the finger edge region extends a total of between 1 μm and 4 μm in the nwell length direction, and is recessed from an edge of the nwell finger in the nwell width direction.

17. The integrated circuit of claim 12, wherein the at least one nwell finger comprises a plurality of nwell fingers.

18. The integrated circuit of claim 12, wherein said DEPMOS device has a symmetric drain structure.

* * * * *